United States Patent
Shioiri et al.

(10) Patent No.: US 10,678,486 B2
(45) Date of Patent: Jun. 9, 2020

(54) PRINTING APPARATUS CONTROLLING SPOOLING OF IMAGE DATA IN VOLATILE AND NON-VOLATILE MEMORIES BASED ON MEMORY CAPACITY

(71) Applicant: CANON KABUSHIKI KAISHA, Tokyo (JP)

(72) Inventors: Hiroyuki Shioiri, Yokohama (JP); Kazuya Sato, Sagamihara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/359,337

(22) Filed: Mar. 20, 2019

(65) Prior Publication Data

US 2019/0303064 A1    Oct. 3, 2019

(30) Foreign Application Priority Data

Mar. 30, 2018 (JP) ................. 2018-067759

(51) Int. Cl.

| G06F 15/00 | (2006.01) |
|---|---|
| G06F 3/12 | (2006.01) |
| G06K 1/00 | (2006.01) |
| G06F 12/02 | (2006.01) |
| G11C 11/4072 | (2006.01) |
| G06F 11/10 | (2006.01) |

(52) U.S. Cl.
CPC .......... *G06F 3/1222* (2013.01); *G06F 3/1238* (2013.01); *G06F 3/1279* (2013.01); *G06F 11/1068* (2013.01); *G06F 12/0246* (2013.01); *G11C 11/4072* (2013.01)

(58) Field of Classification Search
CPC .... G06F 3/1222; G06F 3/1238; G06F 3/1279; G06F 11/1068; G06F 12/0246; G11C 11/4072
USPC ............... 358/1.15, 1.14, 1.13, 1.1
See application file for complete search history.

(56) References Cited

U.S. PATENT DOCUMENTS

| 9,076,098 B2 | 7/2015 | Sato | |
| 2005/0130738 A1* | 6/2005 | Miyamoto | ............. A63F 13/10 463/30 |
| 2007/0046968 A1* | 3/2007 | Oswald | ................ G06F 3/1212 358/1.13 |

FOREIGN PATENT DOCUMENTS

JP     2016-4403     1/2016

* cited by examiner

*Primary Examiner* — Douglas Q Tran
(74) *Attorney, Agent, or Firm* — Venable LLP

(57) ABSTRACT

When image data cannot be spooled in a non-volatile memory due to a shortage in an available capacity of the non-volatile memory, an attempt to spool the image data in a volatile memory is started after an available capacity of the volatile memory is increased to enable the volatile memory to spool the image data.

20 Claims, 11 Drawing Sheets

| ← | DEVICE INFORMATION | LOG OUT |

| INFORMATION ON SHEET FEEDING | > |
| INFORMATION ON EXPENDABLES | > |
| CHECK COUNTER | > |
| AMOUNT OF SECURE PRINTING MEMORY USED : 80M / 80MB | |
| VERSION INFORMATION | > |
| SERIAL No. :@@@@@ | |
| HEAD INFORMATION | > |

FIG.11

PRINTING APPARATUS CONTROLLING SPOOLING OF IMAGE DATA IN VOLATILE AND NON-VOLATILE MEMORIES BASED ON MEMORY CAPACITY

BACKGROUND OF THE INVENTION

Field of the Invention

The present invention relates to a printing apparatus, a printing method, and a storage medium, which use both a volatile memory and a non-volatile memory for storing image data.

Description of the Related Art

Among printing apparatuses shared in offices and the like, there is a printing apparatus adopting a mode in which the printing apparatus does not output a printed material after transmission of image data by a user unless the user actually arrives at a location of the printing apparatus, and starts printing when the user permits the printing apparatus to execute the printing. This printing mode is referred to as secure printing from the viewpoint of information security. On the other hand, a mode in which the printing apparatus starts the printing at the point of transmission of the image data is referred to as non-secure printing. In the meantime, temporary storage of the image data is referred to as spooling and a memory area for the spooling is referred to as a spool buffer.

In the secure printing, it is desirable from the viewpoint of security to delete the data from the spool buffer immediately after completion of the printing. In this regard, a DRAM which is a volatile memory is suitable for the spool buffer. However, the relatively costly DRAM needs to be provided with a minimum requisite capacity. Accordingly, if part of the limited capacity is used as the spool buffer, there is risk of causing a shortage in capacity whereby the DRAM is unable to store image data that are transmitted from multiple users. When a non-volatile semiconductor memory is used together as the spool buffer, the use of a non-volatile semiconductor memory such as a NAND flash memory is more practical than using an HDD because the NAND flash memory has advantages in lower cost and higher capacity over the HDD. Nonetheless, the NAND flash memory has a limitation in the number of times of data rewriting, and blocks that undergo the repeated rewriting in excess of the allowable number of times become unusable.

According to a technique described in Japanese Patent Laid-Open No. 2016-4403, an available capacity of a NAND flash memory is compared with a specific capacity set based on a state of the NAND flash memory, and data is written into the NAND flash memory when the available capacity is equal to or above the specific capacity. On the other hand, when the available capacity is smaller than the specific capacity, the data is written into the NAND flash memory after temporarily transferring certain data having been stored in the NAND flash memory to another storage unit in order to secure the specific capacity.

SUMMARY OF THE INVENTION

However, when the data is saved in one of the DRAM and the NAND flash memory having the available capacity as described in Japanese Patent Laid-Open No. 2016-4403, there is risk of a failure to save the data due to a shortage in the available capacity of the memory in the process of saving the data. In this case, a destination for saving the data has to be changed and the number of times of writing the data into the NAND flash memory will be increased as a consequence.

The present invention aims to extend the product life of a non-volatile memory in a case of using a volatile memory and the non-volatile memory together as spool buffers for image data, by reducing the number of times of writing the image data into the non-volatile memory.

In the first aspect of the present invention, there is provided a printing apparatus configured to print an image based on image data, comprising:
a volatile memory;
a non-volatile memory having a limitation in the number of times of rewriting;
a processing unit configured to process the image data spooled in the volatile memory and in the non-volatile memory; and
a control unit configured to attempt to spool the image data in the volatile memory, and to attempt to spool the image data in the non-volatile memory when the image data is not successfully spooled in the volatile memory due to a shortage in an available capacity of the volatile memory, wherein
when the image data is not successfully spooled in the non-volatile memory due to a shortage in an available capacity of the non-volatile memory, the control unit starts an attempt to spool the image data in the volatile memory after the available capacity of the volatile memory is increased to enable the volatile memory to spool the image data.

In the second aspect of the present invention, there is provided a printing method of printing an image based on image data, comprising:
a processing step of processing the image data spooled in a volatile memory and in a non-volatile memory; and
a controlling step of attempting to spool the image data in the volatile memory, and attempting to spool the image data in the non-volatile memory when the image data is not successfully spooled in the volatile memory due to a shortage in an available capacity of the volatile memory, wherein
when the image data is not successfully spooled in the non-volatile memory due to a shortage in an available capacity of the non-volatile memory, an attempt to spool the image data in the volatile memory is started in the controlling step after the available capacity of the volatile memory is increased to enable the volatile memory to spool the image data.

In the third aspect of the present invention, there is provided a non-transitory computer readable storage medium storing program codes for executing a printing method of printing an image based on image data, the printing method comprising:
a processing step of processing the image data spooled in a volatile memory and in a non-volatile memory; and
a controlling step of attempting to spool the image data in the volatile memory, and attempting to spool the image data in the non-volatile memory when the image data is not successfully spooled in the volatile memory due to a shortage in an available capacity of the volatile memory, wherein
when the image data is not successfully spooled in the non-volatile memory due to a shortage in an available capacity of the non-volatile memory, an attempt to spool the image data in the volatile memory is started in the controlling step after the available capacity of the volatile memory is increased to enable the volatile memory to spool the image data.

According to the present invention, it is possible to reduce the number of times of writing image data into a non-volatile memory and thus to extend the product life of the non-volatile memory.

Further features of the present invention will become apparent from the following description of exemplary embodiments with reference to the attached drawings.

BRIEF DESCRIPTION OF THE DRAWINGS

FIG. 11 is an explanatory diagram of a display example of an operating panel.

DESCRIPTION OF THE EMBODIMENTS

An embodiment of the present invention will be described below with reference to the drawings.

<Regarding Configuration of Printing Apparatus>

Figure 1:
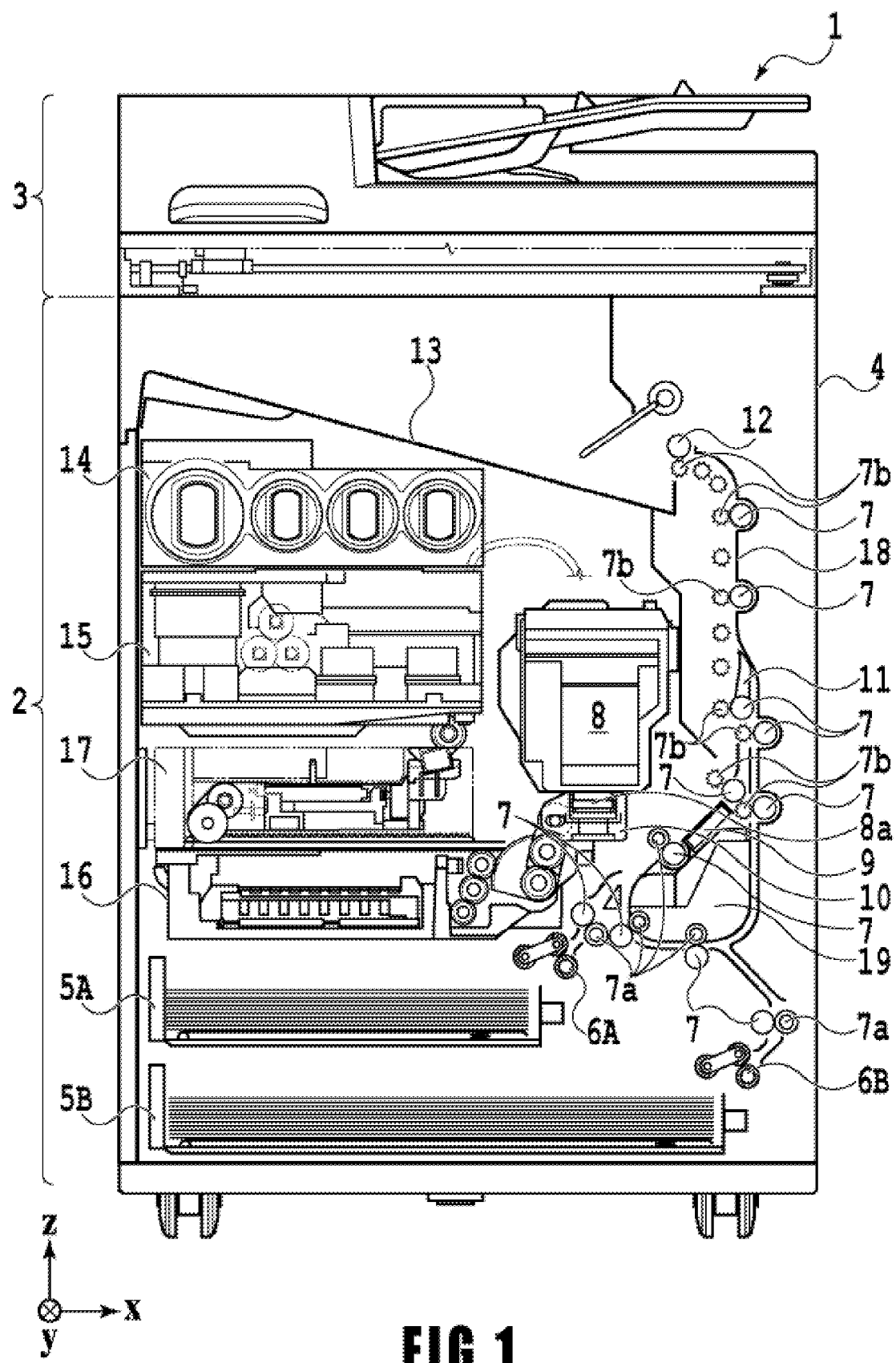
FIG. 1 is a diagram illustrating a printing apparatus in the standby state.

FIG. 1 is an internal configuration diagram of an inkjet printing apparatus 1 (hereinafter "printing apparatus 1") used in the present embodiment. In the drawings, an x-direction is a horizontal direction, a y-direction (a direction perpendicular to paper) is a direction in which ejection openings are arrayed in a print head 8 described later, and a z-direction is a vertical direction.

The printing apparatus 1 is a multifunction printer comprising a print unit 2 and a scanner unit 3. The printing apparatus 1 can use the print unit 2 and the scanner unit 3 separately or in synchronization to perform various processes related to print operation and scan operation. The scanner unit 3 comprises an automatic document feeder (ADF) and a flatbed scanner (FBS) and is capable of scanning a document automatically fed by the ADF as well as scanning a document placed by a user on a document plate of the FBS. The present embodiment is directed to the multifunction printer comprising both the print unit 2 and the scanner unit 3, but the scanner unit 3 may be omitted. FIG. 1 shows the printing apparatus 1 in a standby state in which neither print operation nor scan operation is performed.

In the print unit 2, a first cassette 5A and a second cassette 5B for housing printing medium (cut sheets) S are detachably provided at the bottom of a casing 4 in the vertical direction. Relatively small printing medium of up to A4 size are stacked and housed in the first cassette 5A and relatively large printing medium of up to A3 size are stacked and hosed in the second cassette 5B. A first feeding unit 6A for feeding housed printing medium one by one is provided near the first cassette 5A. Similarly, a second feeding unit 6B is provided near the second cassette 5B. In print operation, a print medium S is selectively fed from either one of the cassettes.

Conveying rollers 7, a discharging roller 12, pinch rollers 7a, spurs 7b, a guide 18, an inner guide 19, and a flapper 11 are conveying mechanisms for guiding a print medium S in a predetermined direction. The conveying rollers 7 are drive rollers located upstream and downstream of the print head 8 and driven by a conveying motor (not shown). The pinch rollers 7a are follower rollers that are turned while nipping a print medium S together with the conveying rollers 7. The discharging roller 12 is a drive roller located downstream of the conveying rollers 7 and driven by the conveying motor (not shown). The spurs 7b nip and convey a print medium S together with the conveying rollers 7 and discharging roller 12 located downstream of the print head 8.

The guide 18 is provided in a conveying path of a print medium S to guide the print medium S in a predetermined direction. The inner guide 19 is a member extending in the y-direction. The inner guide 19 has a curved side surface and guides a print medium S along the side surface. The flapper 11 is a member for changing a direction in which a print medium S is conveyed in duplex print operation. A discharging tray 13 is a tray for stacking and housing printing medium S that were subjected to print operation and discharged by the discharging roller 12.

The print head 8 of the present embodiment is a full line type color inkjet print head. In the print head 8, a plurality of ejection openings configured to eject ink based on print data are arrayed in the y-direction in FIG. 1 so as to correspond to the width of a print medium S. That is, the print head is configured to eject inks of a plurality of colors. When the print head 8 is in a standby position, an ejection opening surface 8a of the print head 8 is oriented vertically downward and capped with a cap unit 10 as shown in FIG. 1. In print operation, the orientation of the print head 8 is changed by a print controller 202 described later such that the ejection opening surface 8a faces a platen 9. The platen 9 includes a flat plate extending in the y-direction and supports a print medium S being subjected to print operation by the print head 8 from the back side. The movement of the print head 8 from the standby position to a printing position will be described later in detail.

An ink tank unit 14 separately stores ink of four colors to be supplied to the print head 8. An ink supply unit 15 is provided in the midstream of a flow path connecting the ink tank unit 14 to the print head 8 to adjust the pressure and flow rate of ink in the print head 8 within a suitable range. The present embodiment adopts a circulation type ink supply system, where the ink supply unit 15 adjusts the pressure of ink supplied to the print head 8 and the flow rate of ink collected from the print head 8 within a suitable range.

A maintenance unit 16 comprises the cap unit 10 and a wiping unit 17 and activates them at predetermined timings to perform maintenance operation for the print head 8. The maintenance operation will be described later in detail.

Figure 2:
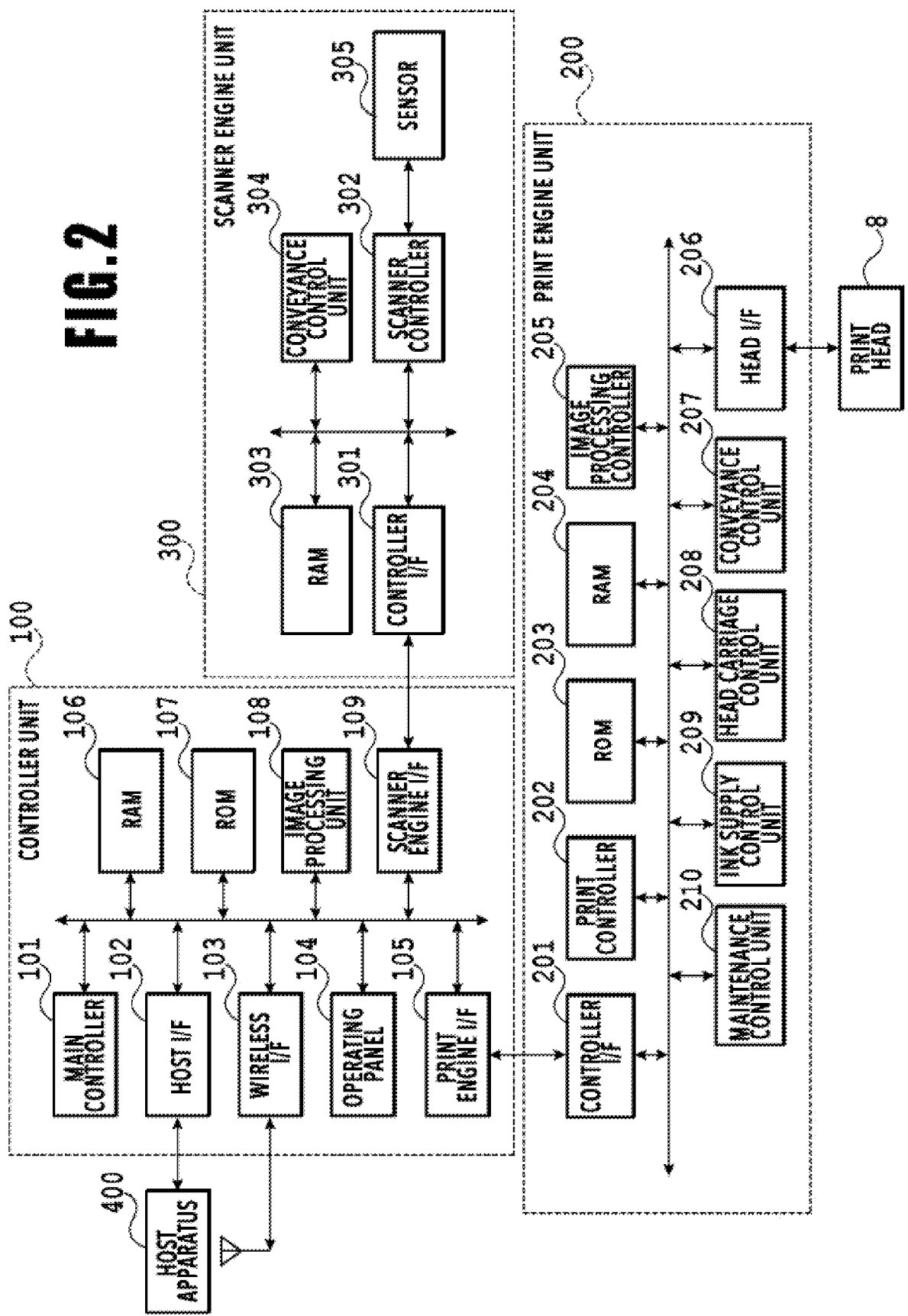
FIG. 2 is a control configuration diagram of the printing apparatus.

FIG. 2 is a block diagram showing a control configuration in the printing apparatus 1. The control configuration mainly includes a print engine unit 200 that exercises control over the print unit 2, a scanner engine unit 300 that exercises control over the scanner unit 3, and a controller unit 100 that exercises control over the entire printing apparatus 1. A print controller 202 controls various mechanisms of the print engine unit 200 under instructions from a main controller 101 of the controller unit 100. Various mechanisms of the scanner engine unit 300 are controlled by the main controller 101 of the controller unit 100. The control configuration will be described below in detail.

In the controller unit 100, the main controller 101 including a CPU controls the entire printing apparatus 1 using a RAM 106 as a work area in accordance with various parameters and programs stored in a ROM 107. For example, when a print job is input from a host apparatus 400 via a host I/F (each interface will be hereinafter abbreviated as I/F) 102 or a wireless I/F 103, an image processing unit 108 executes predetermined image processing for received image data under instructions from the main controller 101. The main controller 101 transmits the image data (such as RGB data) subjected to the image processing to the print engine unit 200 via a print engine I/F 105.

The printing apparatus 1 may acquire image data from the host apparatus 400 via a wireless or wired communication or acquire image data from an external storage unit (such as a USB memory) connected to the printing apparatus 1. A communication system used for the wireless or wired communication is not limited. For example, as a communication system for the wireless communication, Wi-Fi (Wireless Fidelity; registered trademark) and Bluetooth (registered trademark) can be used. As a communication system for the wired communication, a USB (Universal Serial Bus) and the like can be used. For example, when a scan command is input from the host apparatus 400, the main controller 101 transmits the command to the scanner unit 3 via a scanner engine I/F 109.

An operating panel 104 is a mechanism to allow a user to do input and output for the printing apparatus 1. A user can give an instruction to perform operation such as copying and scanning, set a print mode, and recognize information about the printing apparatus 1 via the operating panel 104.

In the print engine unit 200, the print controller 202 including a CPU controls various mechanisms of the print unit 2 using a RAM 204 as a work area in accordance with various parameters and programs stored in a ROM 203. When various commands and image data are received via a controller I/F 201, the print controller 202 temporarily stores them in the RAM 204. The print controller 202 allows an image processing controller 205 to convert the stored image data into print data such that the print head 8 can use it for print operation. After the generation of the print data, the print controller 202 allows the print head 8 to perform print operation based on the print data via a head I/F 206. At this time, the print controller 202 conveys a print medium S by driving the feeding units 6A and 6B, conveying rollers 7, discharging roller 12, and flapper 11 shown in FIG. 1 via a conveyance control unit 207. The print head 8 performs print operation in synchronization with the conveyance operation of the print medium S under instructions from the print controller 202, thereby performing printing.

A head carriage control unit 208 changes the orientation and position of the print head 8 in accordance with an operating state of the printing apparatus 1 such as a maintenance state or a printing state. An ink supply control unit 209 controls the ink supply unit 15 such that the pressure of ink supplied to the print head 8 is within a suitable range. A maintenance control unit 210 controls the operation of the cap unit 10 and wiping unit 17 in the maintenance unit 16 when performing maintenance operation for the print head 8.

In the scanner engine unit 300, the main controller 101 controls hardware resources of the scanner controller 302 using the RAM 106 as a work area in accordance with various parameters and programs stored in the ROM 107, thereby controlling various mechanisms of the scanner unit 3. For example, the main controller 101 controls hardware resources in the scanner controller 302 via a controller I/F 301 to cause a conveyance control unit 304 to convey a document placed by a user on the ADF and cause a sensor 305 to scan the document. The scanner controller 302 stores scanned image data in a RAM 303. The print controller 202 can convert the image data acquired as described above into print data to enable the print head 8 to perform print operation based on the image data scanned by the scanner controller 302.

<Regarding Configuration of Controller Unit>

Figure 3:
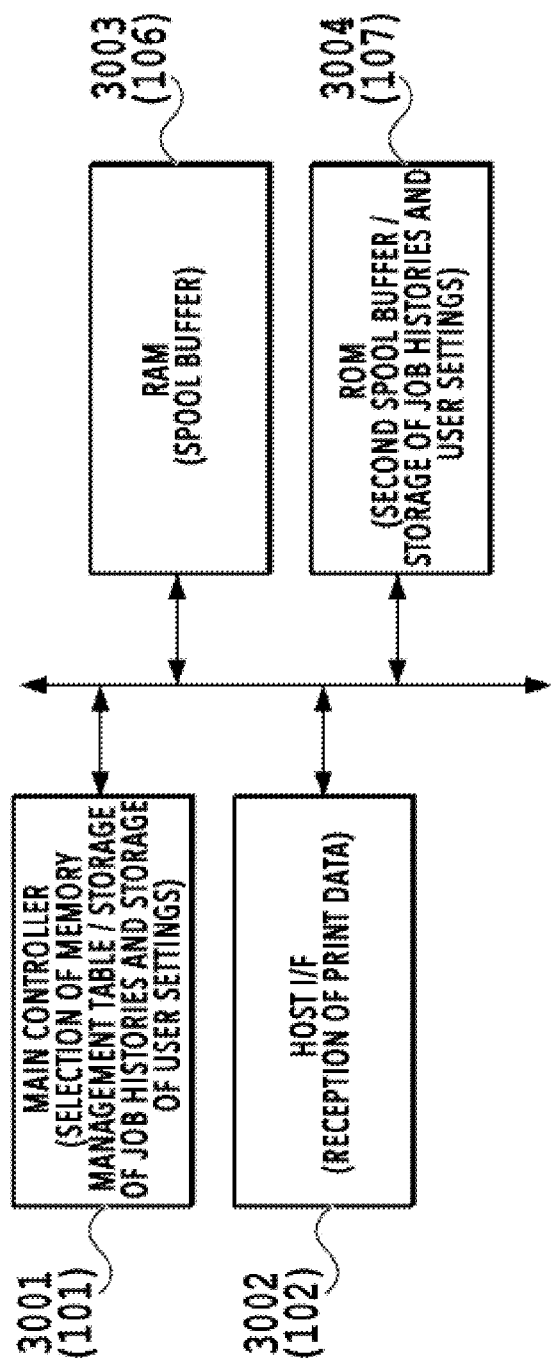
FIG. 3 is a block diagram of a substantial part of a control system of the printing apparatus.

FIG. 3 is a block diagram illustrating the constituents that are particularly important in this embodiment, which are extracted from the constituents shown in FIG. 2. In FIG. 3, the main controller 101, the host I/F 102, the RAM 106, and the ROM 107 shown in FIG. 2 are renumbered as a main controller 3001, a host I/F 3002, a RAM 3003, and a ROM 3004, respectively.

The image data received from the host I/F 3002 is developed into a bitmap, then subjected to compression processing and the like as needed, and then temporarily stored in a spool buffer of the printing apparatus 1. As described later, printing modes include secure printing and non-secure printing. When both of these modes are used, then it is necessary to prepare two types of spool buffers for the secure printing and the non-secure printing. In the non-secure printing, data output is started in order as soon as the print engine unit 200 is available. For this reason, the image data for the non-secure printing remain in the printing apparatus 1 for a short time, so that the spool buffer with a small capacity can handle the processing even when multiple users transmit the image data. The spool buffer for the non-secure printing can therefore be realized only by using an area in the RAM 3003. Meanwhile, a large-capacity spool buffer is required in the secure printing because a large amount of image data remain in the printing apparatus 1 in a case where multiple users transmit the image data but those users do not instruct printing (output) in front of the printing apparatus, for instance. The spool buffer for the secure printing is therefore secured both on the RAM 3003 and the ROM 3004.

An SRAM in an IC that controls the printing apparatus 1 may be used as the RAM 3003, or a DRAM outside the IC may be used as the RAM 3003. Note that this embodiment assumes to use the DRAM because the spool buffer requires a memory area with a relatively large capacity. In the meantime, a NOR flash memory or a NAND flash memory may be used as the ROM 3004. However, the use of the NAND flash memory is desirable in light of the necessity of a large-capacity memory area. This embodiment assumes to use an embedded multi-media card (eMMC) which incorporates a controller unit, which is configured to perform control such as wear leveling, into a chip together with a NAND flash memory. A spool area on the eMMC may be a non-file system area that can be observed on the memory map directly from the CPU or may be a file system area to be observed via a file system. In this embodiment, the spool area on the eMMC is assumed to be a non-file system area.

As mentioned above, the ROM has a limitation in the number of times of rewriting. Accordingly, spool data is usually stored in the RAM that does not have a limitation in the number of times of rewriting and it is preferable to use the ROM supplementarily in such a way as to store data in the ROM only in a case of exceeding the capacity of the spool buffer secured in the RAM. Meanwhile, since the image data may contain confidential information on a user, it is desirable to delete the image data after the printing from the printing apparatus unless the circumstances are exceptional. It is convenient to store the spool data in the RAM because the image data in the RAM is automatically deleted by turning off power supply to the printing apparatus 1 even in case of a failure to delete the image data. On the other hand, when the spool data is stored in the ROM, the image data in the ROM is not automatically deleted by turning off the power supply to the printing apparatus 1. Accordingly, the ROM has a disadvantage over the RAM from the view point of security. In addition, the ROM involves two writing operations which are a recording operation and a deleting operation of the image data, and therefore has a disadvantage over the RAM in light of the limitation in the number of times of rewriting as well.

From the above-mentioned points of view, FIG. 3 describes the RAM 3003 as a first spool buffer which is a buffer having a high priority for use in both the secure printing and the non-secure printing. On the other hand, the ROM 3004 is described therein as a second spool buffer which is a buffer having a low priority for use only in the secure printing. In this embodiment, the ROM 3004 is used as the second spool buffer only at the time of the secure printing, and deletion of the spool data from the ROM 3004 is certainly executed after printing the image data, at a lapse of a certain period of time after the data storage, and when turning off the power supply to the printing apparatus 1. Here, an example of the spool data of this embodiment is print data.

<Regarding Secure Printing and Non-Secure Printing>

A printing apparatus shared by multiple users in an office or the like is usually connected to a local network in the office. In this environment, the image data are transmitted from information terminals of the respective users to the shared printing apparatus through the network and the users are supposed to retrieve their printed materials from the shared printing apparatus. The printed materials outputted from the printing apparatus by the users may contain confidential information. Accordingly, the following situations may occur if the printing apparatus outputs the printed materials immediately after the users transmit the image data. Specifically, when a certain user takes time to retrieve the printed material outputted from the printing apparatus, the confidential information contained in the printed material may be exposed to other users or the printing material may be taken away by another user.

In the secure printing, after a user transmits the print data to the printing apparatus, the printed material is not outputted until the user actually arrives at a location of the printing apparatus. Here, the printing is started when the user permits the printing apparatus to execute the printing. In contrast, in the non-secure printing, the printing is started at the point of transmission of the image data.

Means for holding the image data and means for allowing the printing apparatus to identify the user who transmits the image data and to actually output the printed material in response to a permission by the authorized user are required in order to provide the environment that enables the secure printing. As for the means for identifying the user, there is a method of notifying a user of an ID number for identification every time a print job is created and causing the user to input the ID number to the printing apparatus, for instance. As another example, there is a method of registering a user ID as an identification number in advance with an ID card owned by the user, and allowing the user to attach the user ID to a print job at the time of transmission of the print job from the information terminal, thus allowing the printing apparatus to associate the user with the print job.

In the meantime, as for the means for holding the image data, there is a method of installing a printer server for performing centralized control of the image data. The print data from the respective users are temporarily stored in the printer server. When a certain user issues a permission for the printing apparatus to execute the printing, the printing apparatus sends the ID number of the user to the printer server whereby the image data is sent from the printer server to the printing apparatus. In general, the printer server is designed to secure a spool buffer having a larger capacity than an estimated amount of the image data in the office where the printer server is installed. Furthermore, in order not to cause an overflow of the spool buffer, the printer server adopts a method of deleting certain image data after a lapse of a predetermined period of time from a point of generation of the image data.

Nevertheless, there may be a case where such a printer server is not installable in a small office environment due to constraints of costs, installation space, and the like. When the printer server is not installed, the image data are transmitted directly from the respective users to the printing apparatus and the image data need to be spooled inside the printing apparatus. The image data may be described in the PDL and the like, and it takes time to develop the PDL into a bitmap and to generate the image data for a printer therefrom. For this reason, the spool buffer of the printing apparatus spools the image data for the printer which is formed by developing the image data into the bitmap and then subjected to the compression processing and the like.

When the printing apparatus is provided with the spool buffer, a DRAM which is a volatile memory in a printer control unit, or a non-volatile memory such as an HDD is often used as the spool area. The spool buffer is a temporary storage destination of the data until its printing is permitted by the user, and does not have to hold the data after the printing unless the circumstances are exceptional. In the secure printing, it is desirable from the viewpoint of security to delete the data from the spool buffer as soon as the printing is completed. In this regard, the DRAM being the volatile memory is suitable for the spool buffer. However, since a cost per unit memory capacity of the DRAM is relatively high, the DRAM needs to have a minimum requisite capacity as its memory capacity. If part of the limited capacity of the DRAM is used as the spool buffer, there is risk of causing a shortage in capacity whereby the DRAM is unable to store the image data that are transmitted from multiple users. For this reason, an HDD is often used as the spool buffer for its relatively low cost per unit memory capacity. However, the HDD is prone to a mechanical failure such as a breakdown of a disc rotating mechanism. Moreover, the HDD requires relatively large operating power. Given the circumstances, a non-volatile semiconductor memory such as a NAND flash memory is a possible alternative for use as the spool buffer. Amid the advance in price reduction and capacity increase in recent years, applications of the NAND flash memory have been expanded to replace the HDD in light of storage of program data as well as user data, and so forth.

Nonetheless, the NAND flash memory has a limitation in the number of times of data rewriting, and blocks that undergo the repeated rewriting in excess of the allowable number of times becomes unusable. The rewriting cited herein means a set of data writing and data deletion. Since the unusable blocks are treated as defective blocks, unused blocks in the NAND flash memory are allocated as a substitute for the defective blocks. However, the NAND flash memory will not be usable any longer if the defective blocks are increased to the extent that precludes further allocation of the substitute blocks. In order to extend the product life of the NAND flash memory, a controller of the NAND flash memory performs management and control of the rewriting into the respective blocks and allocation of the substitute blocks in such a way as to homogenize the rewriting into the respective blocks by means of equalization processing. The above-described equalization processing is referred to as wear leveling.

In general, the controller of the NAND flash memory is formed inside an ASIC that incorporates a CPU or formed as a separate device that can communicate directly with the CPU, and is configured to control the NAND flash memory under the control of the CPU. Moreover, the data are generally written into and read out of the NAND flash memory by the unit called page that represents a set of memory cells, while the data are generally deleted by the unit called block that represents a set of the pages. Meanwhile, the NAND flash memory cannot directly rewrite the data saved therein due to its structural reason, and it is therefore necessary to read the data to be rewritten from the target page out to the DRAM or the like, to rewrite a section as needed, and then to write the rewritten data again into a different page that has been deleted in advance. Here, in the case where the original target page having stored the data before the rewriting is to be deleted, then it is necessary to read the data together with other data in the same block not targeted for deletion and to write the entire data into another block. For this reason, if the NAND flash memory is used as part of the spool buffer, a frequency of the data deletion is increased because the spooled data basically changes every time the printing takes place. As a consequence, the capacity of the NAND flash memory is prone to dissatisfy the capacity required in its specifications before the end of the product life of (which is represented by the number of sheets expected to be outputted from) the printing apparatus. If the NAND flash memory is also used for storing control programs of the printing apparatus, log data, and the like, then the printing apparatus may become inoperable in this case.

<Regarding Management of Memory Areas>

Figure 4:
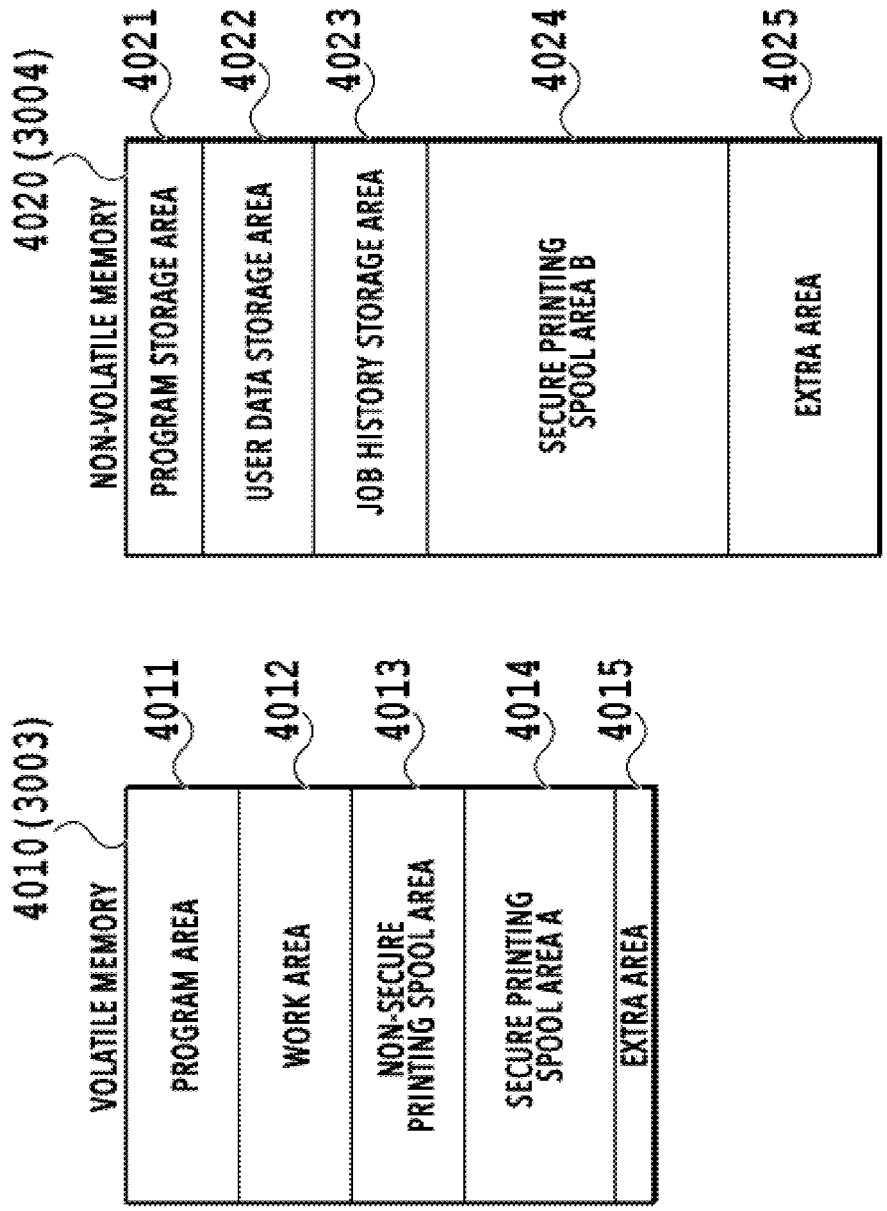
FIG. 4A is a memory map for explaining management of areas inside a volatile memory and FIG. 4B is a memory map for explaining management of areas inside a non-volatile memory.

FIG. 4A is an explanatory diagram for management of areas inside a volatile memory and FIG. 4B is an explanatory diagram for management of areas inside a non-volatile memory. In FIGS. 4A and 4B, the RAM 3003 shown in FIG. 3 is described as a volatile memory 4010 while the ROM 3004 therein is described as a non-volatile memory 4020.

The volatile memory 4010 includes a program area 4011, a work area 4012, a non-secure printing spool area 4013, a secure printing spool area A 4014, and an extra area 4015. The program area 4011 is an area to store an execution program which is copied from the non-volatile memory 4020. The booted CPU fetches the program from this area to start operation. However, the execution program may also be directly fetched from the non-volatile memory. In this respect, the program area in the volatile memory is not essential. The work area 4012 is an area to store data in progress during the processing, and the like. The non-secure printing spool area 4013 stores the spool data used only in the non-secure printing. The secure printing spool area A 4014 stores the spool data used only in the secure printing. These spool areas 4013 and 4014 can be regarded as part of the work area in a broader sense. However, these spool areas are described separately from the work area herein for the sake of convenience to mention the management mode of the memory areas. The extra area 4015 includes blocks used for internal management of the volatile memory 4010, or more specifically, blocks to be substituted for defective blocks and the like.

The non-volatile memory 4020 includes a program storage area 4021, a user data storage area 4022, a job history storage area 4023, a secure printing spool area B 4024, and an extra area 4025. A substance of a program to be executed is stored in the program storage area 4021. As mentioned above, the CPU is operated by copying the program stored in the program storage area 4021 to the volatile memory 4010 and then fetching the program therefrom, or is operated by directly fetching the program from the non-volatile memory 4020. In this embodiment, the program to be executed which is stored in the program storage area 4021 includes information (maintenance information) used in a maintenance operation on the print head. The maintenance information is data concerning a schedule to execute the maintenance operation at a prescribed timing, for example.

User data is stored in the user data storage area 4022. Specifically, the user data is information concerning various settings with the printing apparatus 1 including a telephone directory and an address book of the user, brightness of a liquid crystal display (LCD) unit, a sound volume of a UI, and the like. Note that information concerning division of the spool buffers, switching of the spool buffer to be used, and so forth is also stored in the user data storage area 4022 as the information used in this embodiment. The information concerning the division of the spool buffers is information concerning the size of the spool area in the volatile memory 4010 and the size of the spool area in the non-volatile memory 4020, for example. Meanwhile, the information concerning the switching of the spool buffer is information concerning the size of the spool data, for example. Depending on the size of the spool data to be stored, the destination to spool the data is determined from either the secure printing spool area A 4014 or the secure printing spool area B 4024.

Information concerning the number of print jobs received in a predetermined period such as one day or one week, the sizes of the image data, and the like is stored in the job history storage area 4023. The secure printing spool area B 4024 stores the spool data used only in the secure printing. The secure printing spool area B 4024 is used when the spool data having a larger size than the available capacity of the secure printing spool area A 4014 in the volatile memory 4010 is generated. The extra area 4025 includes blocks used for internal management of the non-volatile memory 4020, or more specifically, blocks to be substituted for defective blocks and the like.

<Regarding Image Data Saving>

Figure 5:
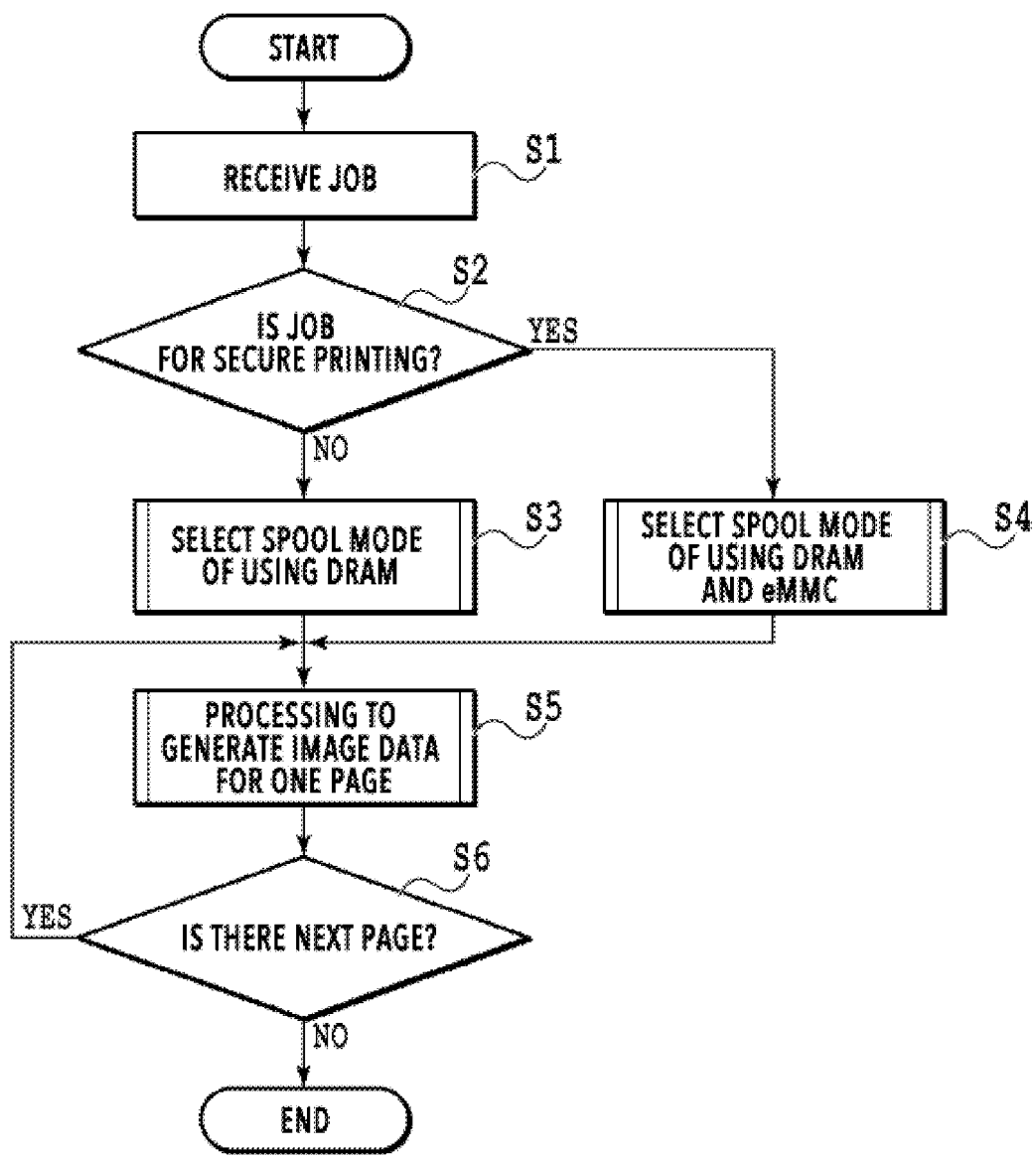
FIG. 5 is a flowchart for explaining spool processing of image data.

FIG. 5 is a flowchart for explaining spool processing of the image data for the printer which is generated from the image data for each page. Program codes stored in the ROM 107 are developed in the RAM 106, and the CPU of the controller unit 100 executes the program codes to carry out a series of the processing shown in FIG. 5. Alternatively, part or all of functions of the steps in FIG. 5 may be realized by using hardware such as an ASIC and an electronic circuit. Here, the sign "S" associated with description of each procedure stands for a step.

The controller unit 100 determines whether or not a received print job is a secure printing job (S1 and S2), and sets up a printing mode depending on a result of the determination. As the printing mode, it is possible to set to either a mode of using both the DRAM and the eMMC (a first mode) or a mode of using only the DRAM (a second mode). The secure printing is carried out when setting to the first mode and the non-secure printing is carried out when setting to the second mode.

Specifically, when the received print job is not a job for the secure printing, the controller unit 100 selects the mode of using only the DRAM (the volatile memory) corresponding to the RAM (the first spool buffer) 3003 in FIG. 3 as the spool buffer (S3). Thereafter, the controller unit 100 generates the image data for the printer (the image data for one page) corresponding to the image for one page (a page image) while determining the DRAM as the spool destination of the image data (S5). After the image data for one page is generated, the controller unit 100 determines whether or not there is the next page to be processed (S6). The controller unit 100 repeats the processing to generate the image data in S5 as long as there is the next page. On the other hand, when the received job is determined to be the job for the secure printing, the controller unit 100 selects the mode of using both the DRAM corresponding to the RAM 3003 in FIG. 3 and the eMMC (the non-volatile memory) corresponding to the ROM (the second spool buffer) 3004 in FIG. 3 (S4). Thereafter, the controller unit 100 generates the image data for one page while determining the spool destination of the image data depending on usage conditions of the DRAM and the eMMC (S5).

As described above, the image data are sequentially inputted from the host apparatus 400 to the controller unit 100 on a predetermined unit basis (on a page basis in this example). After the controller unit 100 develops the image data for each predetermined unit into a bitmap, the controller unit 100 generates the image data for the printer by subjecting the developed data to the compression processing and the like, and then spools the generated image data in the spool buffer. The print engine unit 200 generates the print data based on the image data for the printer, and drives the print head 8 based on the print data.

Figure 6:
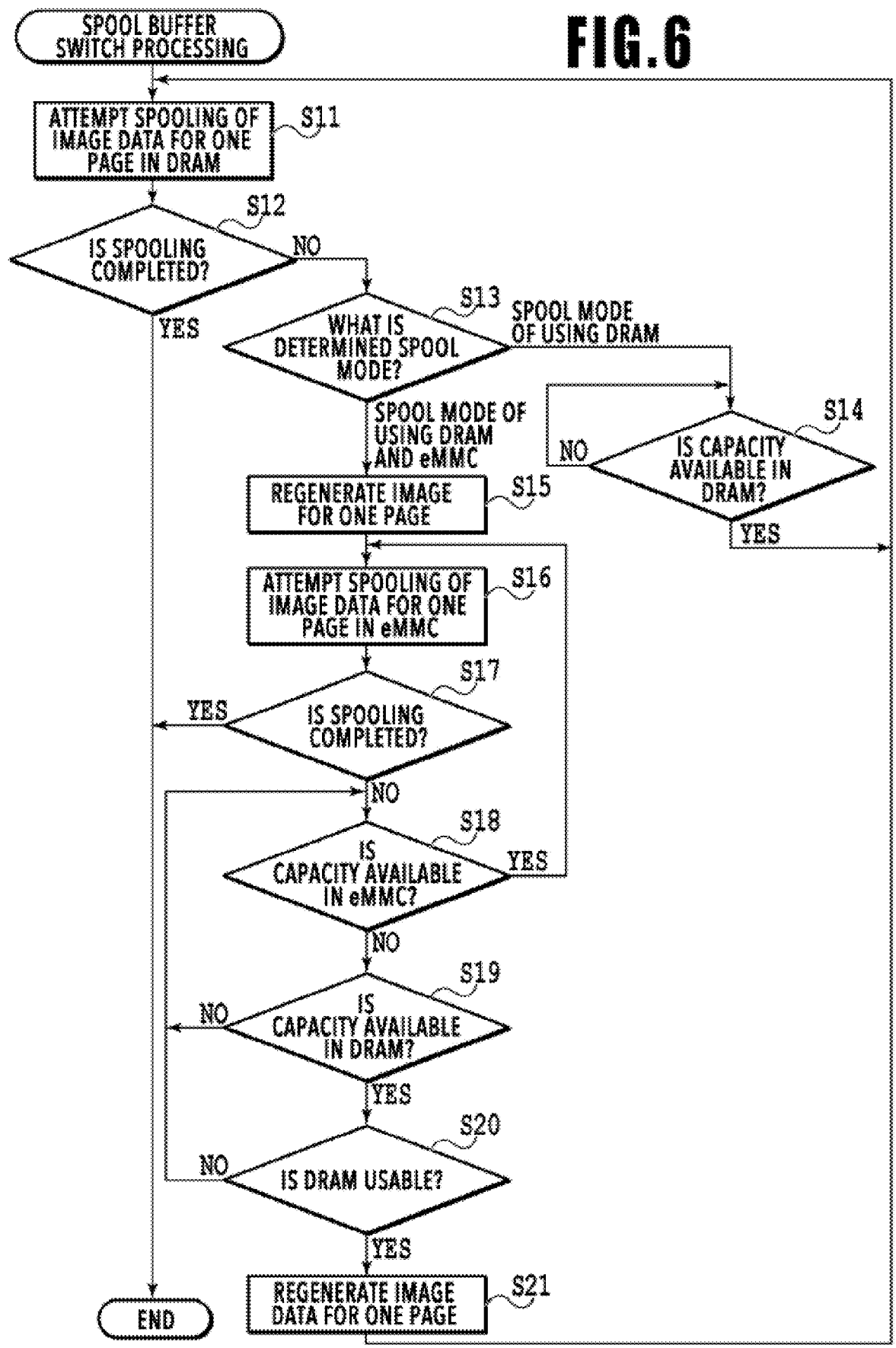
FIG. 6 is a flowchart for explaining spool buffer switch processing.

FIG. 6 is a flowchart for explaining spool buffer switch processing in the processing (S5) to generate the image data for the printer for one page in FIG. 5.

First, the controller unit 100 attempts to spool the image data for the printer for one page in the DRAM (which corresponds to the RAM 3003 in FIG. 3) (S11). When the spooling is completed, the spool buffer switch processing in FIG. 6 is terminated (S12). On the other hand, when the image data for the printer cannot be spooled completely because the capacity of the DRAM becomes full in the middle of the spooling, the controller unit 100 determines the spool mode selected in S3 or S4 in FIG. 5 (S13). When the spool mode of using the DRAM is selected as the spool mode in S3 in FIG. 5, the controller unit 100 stands by until the available capacity is recovered in the DRAM (S14). Such a point of recovery of the available capacity is a point when the available capacity is increased as a consequence of deleting the image data saved in the DRAM. To be more precise, the point when the image data for the printer is deleted is any of a point when the image data for the printer saved in the DRAM is printed on a print medium and the print medium is discharged from the printing apparatus, a point when the printing of the image is cancelled, and the like. When the available capacity of the DRAM is recovered (when the available capacity is increased), the controller unit 100 returns from S14 to S11 and continues the processing.

When the spool mode of using the DRAM and the eMMC is selected as the spool mode in S4, the controller unit 100 switches the spool buffer to the eMMC. Specifically, the controller unit 100 generates the image data for the printer for one page again (S15), and attempts to spool the regenerated image data for the printer for one page in the eMMC (which corresponds to the ROM 3004 in FIG. 3) (S16). In this instance, the image data for the printer corresponding to the same page and saved halfway in the DRAM in the earlier S11 is deleted. Thereafter, the processing in FIG. 6 is terminated when the spooling in the eMMC is completed (S17—Yes). On the other hand, when the image data cannot be spooled completely because the capacity of the eMMC becomes full in the middle of the spooling (S17—No), the controller unit 100 stands by until the available capacity is recovered in the DRAM or the eMMC (S18 and S19). When the available capacity of the eMMC is recovered (when the available capacity is increased), the controller unit 100 returns from S18 to S16 and continues the processing. When the available capacity of the DRAM is recovered, the controller unit 100 determines whether or not it is possible to use the DRAM (S20). Specifically, the controller unit 100 determines whether or not the available capacity of a spool buffer 7001 of the DRAM has a size equal to or above an estimated maximum value calculated from the number of pixels of the generated image data to be spooled. When the determination turns out to be No in S20, the processing of the controller unit 100 returns to S18. On the other hand, when the determination turns out to be Yes in S20, the controller unit 100 regenerates the image data for one page (S21) and then returns to S11. In this instance, the image data saved halfway in the eMMC in the earlier S16 is deleted. Note that when the processing returns to S11 in the situation where the determination turns out to be Yes in S20, the controller unit 100 determines Yes in S12 and the processing in FIG. 6 is therefore completed.

FIGS. 7A to 10C are explanatory diagrams concerning the necessity of the determination processing in S20.

Figure 7A:
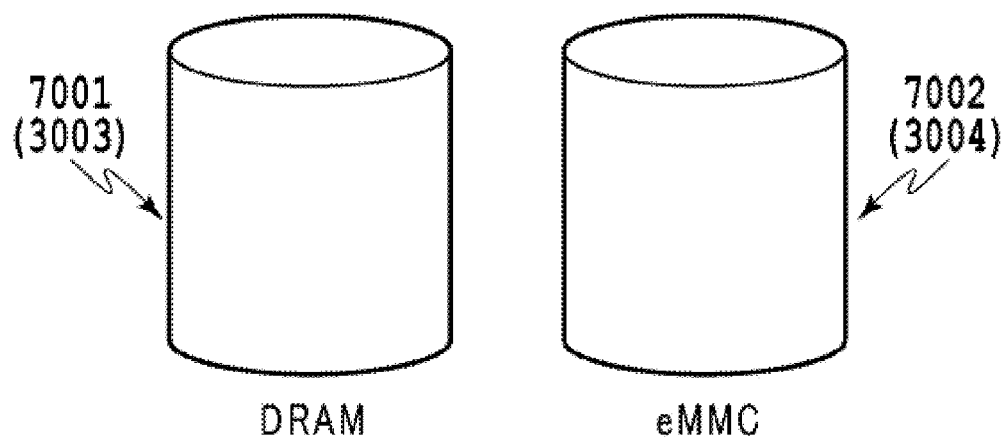
FIGS. 7A and 7B are explanatory diagrams of a specific example of image data spool processing, respectively.
Figure 7B:
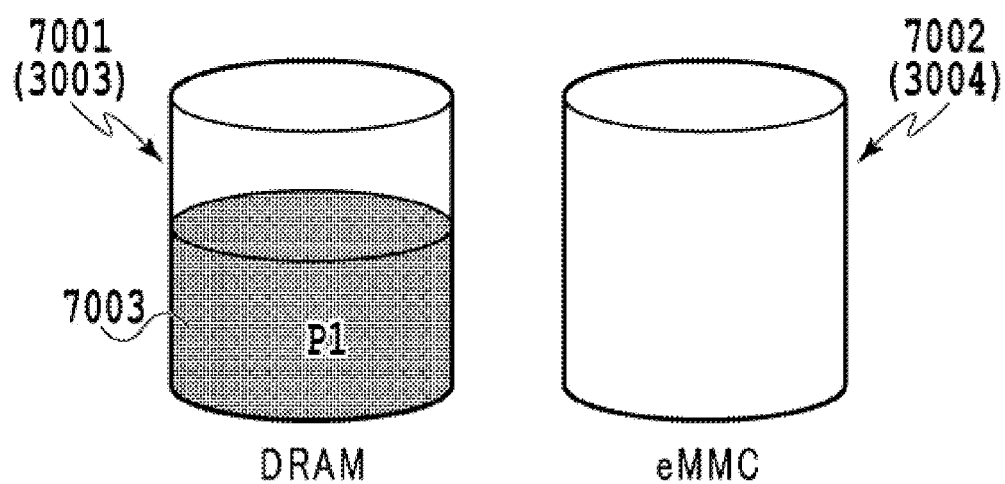

FIG. 7A represents the available capacities of the spool buffer 7001 of the DRAM and a spool buffer 7002 of the eMMC in an initial state. Both of the buffers have sufficient available capacities. In S11 in FIG. 6, image data 7003 for a first page (P1) is spooled in the spool buffer 7001 as shown in FIG. 7B. When the spool buffer 7001 does not become full in this spool processing as shown in FIG. 7B, the generation of the image data for the first page is terminated.

Figure 8A:
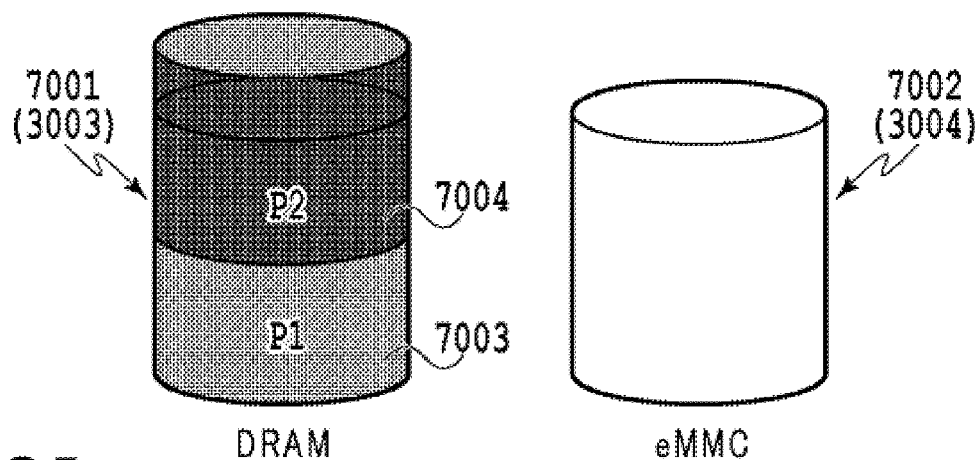
FIGS. 8A, 8B, and 8C are explanatory diagrams of the specific example of the image data spool processing, respectively.
Figure 8B:
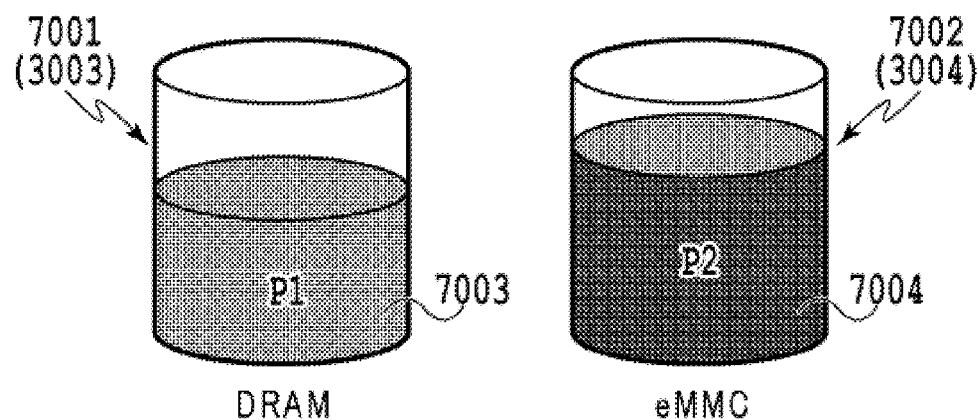

Then, image data 7004 for a second page (P2) is generated as shown in FIG. 8A and an attempt to spool the image data 7004 in the spool buffer 7001 of the DRAM takes place. In the case of FIG. 8A, the spool buffer 7001 becomes full in the middle of this spool processing. Accordingly, the spool destination of the image data 7004 is switched to the spool buffer 7002 of the eMMC. When the image data 7004 is spooled in the spool buffer 7002 as shown in FIG. 8B, the generation of the image data for the second page is terminated.

Figure 8C:
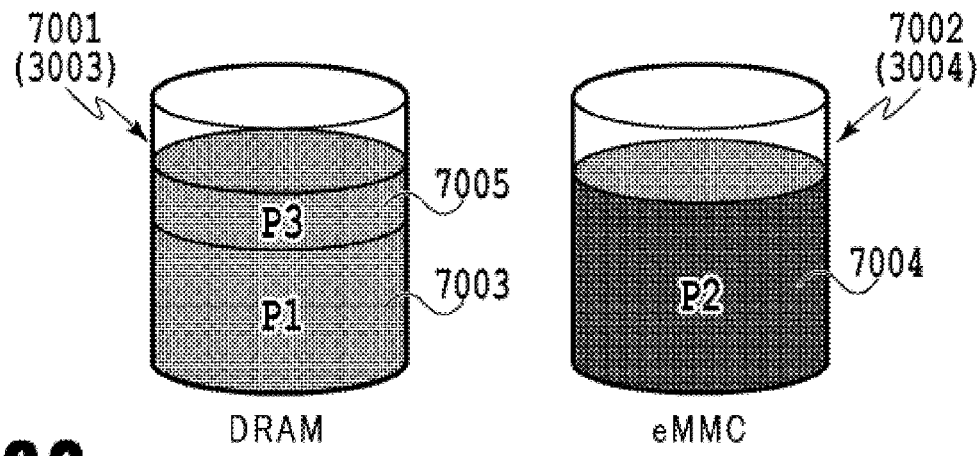

Thereafter, image data 7005 for a third page (P3) is generated as shown in FIG. 8C and an attempt to spool the image data 7005 in the spool buffer 7001 of the DRAM takes place. When the spool buffer 7001 does not become full in this spool processing as shown in FIG. 8C, the generation of the image data for the third page is terminated.

Figure 9A:
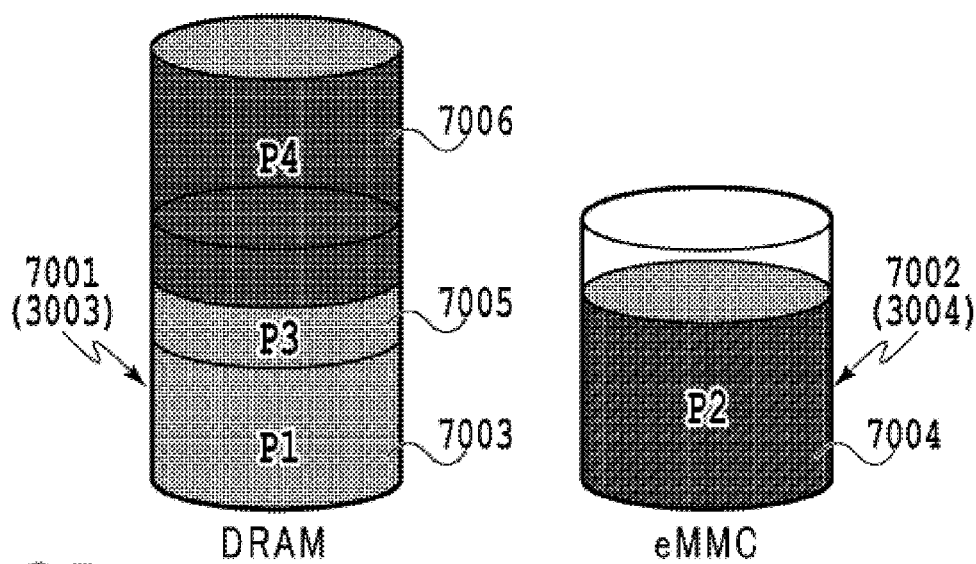
FIGS. 9A, 9B, and 9C are explanatory diagrams of the specific example of the image data spool processing, respectively.

Then, image data 7006 for a fourth page (P4) is generated as shown in FIG. 9A and an attempt to spool the image data 7006 in the spool buffer 7001 of the DRAM takes place. In the case of FIG. 9A, the spool buffer 7001 becomes full in the middle of this spool processing. Accordingly, the spool destination of the image data 7006 is switched and an attempt to spool the image data 7006 in the spool buffer 7002 of the eMMC takes place as shown in FIG. 9B (S16).

Figure 9B:
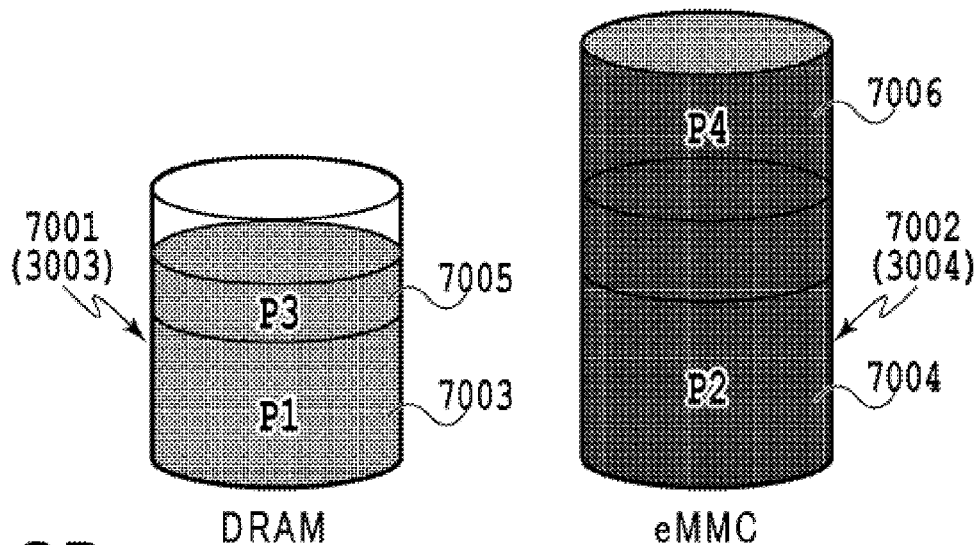
Figure 9C:
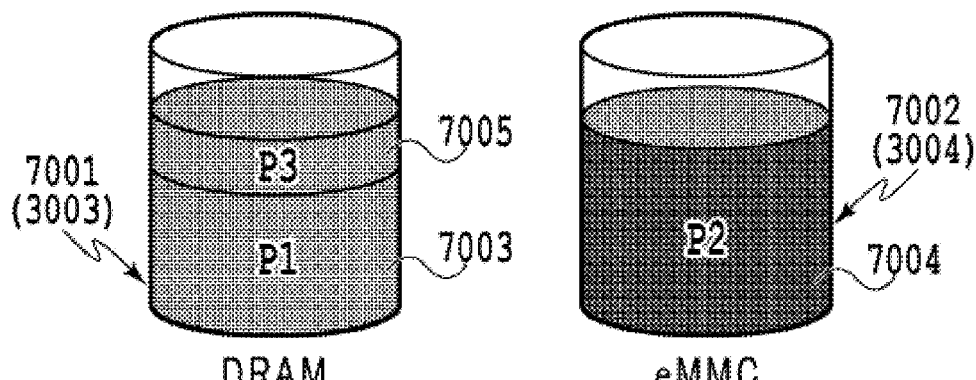

In the case of FIG. 9B, the spool buffer 7002 becomes full in the middle of this spool processing (S17—No). For this reason, the controller unit 100 waits the recovery of the available capacity of the spool buffer 7001 or 7002 as shown in FIG. 9C (S18 and S19).

Thereafter, as the printing operation progresses and the image data 7003 for the first page (P1) is printed, the image data 7003 in the DRAM (in the volatile memory) is deleted and the available capacity is recovered in the spool buffer 7001 of the DRAM.

Figure 10A:
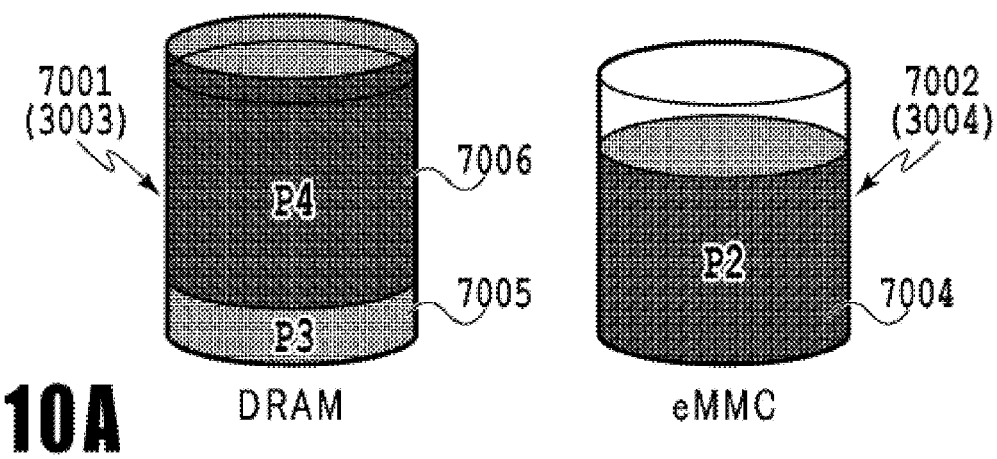
FIGS. 10A, 10B, and 10C are explanatory diagrams of the specific example of the image data spool processing, respectively.
Figure 10B:
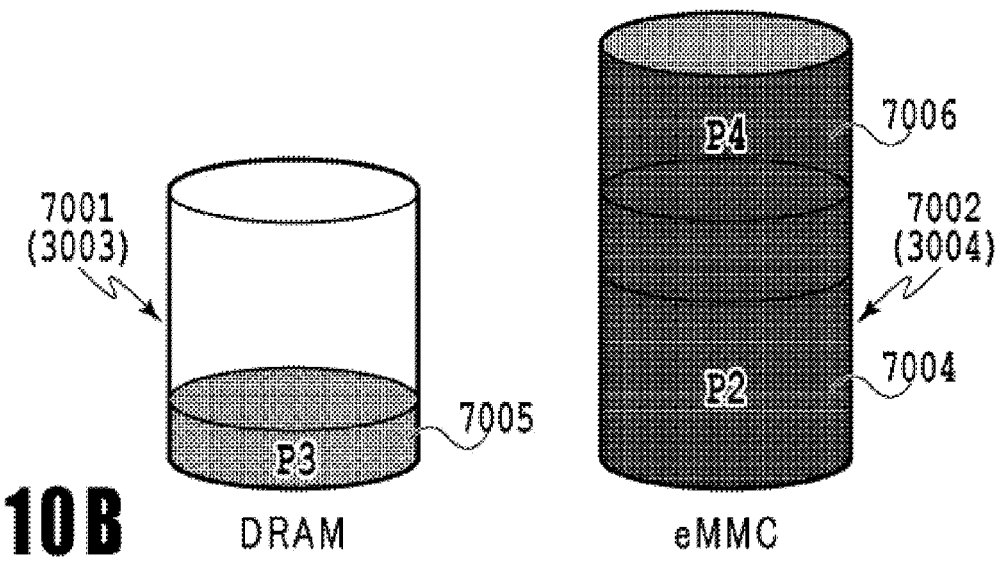
Figure 10C:
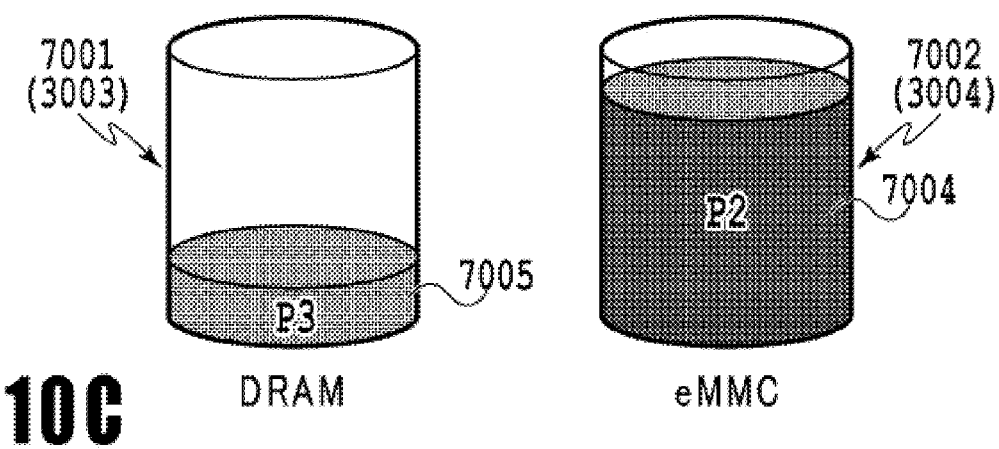

Now, a case without the determination processing in S20 of FIG. 6 will be simulated. In this case, due to the recovery of the capacity in the spool buffer 7001 of the DRAM, the processing moves from S19 to the spool processing (S21 and S11) involving the spool buffer 7001. As a consequence, as shown in FIG. 10A, an attempt to spool the image data 7006 for the fourth page (P4) in the spool buffer 7001 of the DRAM takes place. In the case of FIG. 10A, although the capacity of the DRAM is recovered, the recovered capacity is insufficient for spooling the image data 7006. For this reason, the processing moves again to the spool processing (S15 and S16) involving the eMMC irrespective of whether or not the capacity of the eMMC is recovered, and an attempt to spool the image data 7006 for the fourth page (P4) in the eMMC takes place as shown in FIG. 10B. In the case of FIG. 10B, the available capacity of the eMMC is insufficient as with the case in FIG. 9B. Accordingly, the spool buffer 7002 of the eMMC becomes full in the middle of spooling the image data 7006, which leads to a standby for the recovery of the capacity in the spool buffer 7001 or 7002 again (S18 and 19). As a consequence, the attempt to spool the same data in the eMMC is repeated even though the available capacity remains insufficient. Thereafter, as the image data 7004 for the second page (P2) is printed, the image data 7004 is deleted from the spool buffer 7002 in the eMMC (in the non-volatile memory) as shown in FIG. 10C. In the case of FIG. 10C, a sufficient available capacity is recovered in the eMMC and the image data 7006 for the fourth page (P4) is spooled therein.

As described above, when the determination processing in S20 of FIG. 6 does not take place, the attempt to spool the same image data in the eMMC will be needlessly repeated even though the available capacity of the spool buffer 7002 of the eMMC remains insufficient. In other words, the product life of the eMMC is possibly shortened.

Therefore, in this embodiment, upon the determination that the available capacity is recovered in the spool buffer 7001 of the DRAM (S19), the determination processing in S20 is carried out in advance instead of immediately attempting the spooling in the spool buffer 7001 of the DRAM. In the determination processing, the available capacity of the spool buffer 7001 of the DRAM is compared with the size of the image data to be spooled so as to determine whether or not it is possible to spool the image data in the spool buffer 7001. In other words, the availability of the DRAM is determined from a practical point of view. As a consequence, it is possible to eliminate the needless attempts to spool the same image data in the spool buffer 7002 of the eMMC and thus to reduce the number of times of writing the image data into the eMMC.

Specifically, in the determination processing in S20, it is possible to set the following condition (1) as a condition for determining whether or not the DRAM is available:

(1) the available capacity of the spool buffer 7001 of the DRAM should have the size equal to or above the estimated maximum value calculated from the number of pixels of the generated image data to be spooled.

That is to say, by executing S20, the controller unit 100 starts the attempt to spool the image data for the target page for the printer in the DRAM when (after) the available capacity of the DRAM is increased to be able to save the aforementioned image data. As a result, the spooling in the eMMC is not executed after the determination that the DRAM cannot save the image data for the target page for the printer. Thus, it is possible to extend the product life of the non-volatile memory.

Here, in the determination processing in S20, it is also possible to set the following condition (2) as a condition for determining whether or not the eMMC is available in addition to the DRAM:

(2) the available capacity of the spool buffer 7002 of the eMMC should have the size equal to or above the estimated maximum value calculated from the number of pixels of the generated image data to be spooled.

Addition of the condition (2) to S20 makes it possible to avoid a situation in which the spooling is forced to stand by until the DRAM becomes available even though the eMMC is available.

Note that the condition (1) can also be referred to as a condition for repeating the attempts to spool the image data in the DRAM and the eMMC.

FIG. 11 is an explanatory diagram of a display example of the operating panel 104 (see FIG. 2) of the printing apparatus 1.

When the secure printing is carried out, a total capacity and a used amount of a memory for the secure printing are displayed as a guide for determining how much more image data is acceptable. When the two types of memories of the volatile memory and the non-volatile memory are used at the same as in this embodiment, a total capacity of the DRAM being the volatile memory and the eMMC being the non-volatile memory and a total used amount thereof are displayed. In this embodiment, the DRAM is not put into use at the point when the capacity of the spool buffer 7001 in the DRAM is recovered just a little, so as to reduce the number of times of writing the image data into the eMMC. During the processing of S14, S18, S19, and S20 in FIG. 6, it is in the course of the operation for securing the memory as the spool destination of the image data. Accordingly, all the memories are displayed as being in use to let the user recognize that no image data is receivable at the moment. For instance, when the image data for the first page is printed and is deleted from the DRAM in any of FIGS. 10A, 10B, and 10C, the DRAM has the available capacity but cannot save the image data. In these circumstances, the total capacity of 80 MB of the DRAM and the eMMC is displayed as being in use in the case of FIG. 11, for example.

Other Embodiments

In the above-described first embodiment, the image data for one page is generated (or regenerated) and then the image data is spooled in the spool buffer 7001 of the DRAM or the spool buffer 7002 of the eMMC. Instead, the image data for one page may be generated (or regenerated) and the image data may be spooled in the spool buffer 7001 or 7002 at the same time. In this case, when the image data for one page is generated (or regenerated) and is spooled in the spool buffer 7001 at the same time, the size of the image data being spooled is added to an estimated data size proportional to the number of lines of the portion of the image data yet to undergo the generation processing. Then, the use of the DRAM is continued when the available capacity of the spool buffer 7001 of the DRAM is equal to or above the sum, or the use of the DRAM is discontinued when the available capacity of the spool buffer 7001 thereof is below the sum. In other words, the spool buffer 7001 of the DRAM is used in preference to the spool buffer 7002 of the eMMC and the use of the spool buffer 7001 is discontinued when the spool buffer 7001 is likely to become full. As a consequence, it is possible to reduce the number of times to use the spool buffer 7002 of the eMMC.

Meanwhile, in the above-described embodiment, the image data is developed into the bitmap and then subjected to the compression processing and the like so as to be formed into the image data for the printer, and then the image data for the printer is spooled in the spool buffer. Instead, the image data to be spooled in the spool buffer may be image data from the host apparatus or image data obtained by subjecting the image data from the host apparatus to at least one step of processing.

In the meantime, the above-described embodiment discusses that the available capacity of the spool buffer 7001 of the DRAM in S20 has the size equal to or above the estimated maximum value calculated from the number of pixels of the generated image data to be spooled. However, the size of the available capacity may be defined by a different size. For example, the controller unit 100 may determine whether or not the available capacity of the spool buffer 7001 of the DRAM is a predetermined fixed available capacity. Here, the predetermined available capacity is preferably set to such a capacity that can save nearly all image data that are presumable.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-067759, filed Mar. 30, 2018, which is hereby incorporated by reference wherein in its entirety.

What is claimed is:

1. A printing apparatus configured to print an image based on image data, comprising:
    a volatile memory;
    a non-volatile memory having a limitation in the number of times of rewriting;
    a processing unit configured to process the image data spooled in the volatile memory and in the non-volatile memory; and
    a control unit configured to attempt to spool the image data in the volatile memory, and to attempt to spool the image data in the non-volatile memory when the image data is not successfully spooled in the volatile memory due to a shortage in an available capacity of the volatile memory,
    wherein, when the image data is not successfully spooled in the non-volatile memory due to a shortage in an available capacity of the non-volatile memory, the control unit starts an attempt to spool the image data in the volatile memory after the available capacity of the volatile memory is increased to enable the volatile memory to spool the image data, and
    wherein the processing unit and the control unit are implemented by at least one processor.

2. The printing apparatus according to claim 1, wherein:
    the printing apparatus sequentially inputs the image data on a predetermined unit basis,
    the available capacity of the volatile memory is increased by deletion of the image data in the volatile memory on the predetermined unit basis, and
    the available capacity of the non-volatile memory is increased by deletion of the image data in the non-volatile memory on the predetermined unit basis.

3. The printing apparatus according to claim 2, wherein:
    the printing apparatus prints the image based on the image data for each predetermined unit, and
    the image data for each predetermined unit in any of the volatile memory and the non-volatile memory is deleted as a consequence of the printing of the image corresponding to the image data.

4. The printing apparatus according to claim 2, wherein the predetermined unit is defined on a page basis.

5. The printing apparatus according to claim 1, wherein when the image data is not successfully spooled in the non-volatile memory due to the shortage in the available capacity of the non-volatile memory, the control unit attempts to spool the image data in the non-volatile memory again on condition that the available capacity of the non-volatile memory is increased.

6. The printing apparatus according to claim 1, wherein the image data to be spooled in the volatile memory and in the non-volatile memory is image data developed into a bitmap.

7. The printing apparatus according to claim 1, wherein the printing apparatus is capable of being set to a first mode of allowing the spooling of the image data in the volatile memory and the non-volatile memory and a second mode of allowing the spooling of the image data only in the volatile memory.

8. The printing apparatus according to claim 7, wherein:
    the image data input to the printing apparatus set to the first mode is the image data to be subjected to secure printing, and
    the image data input to the printing apparatus set to the second mode is the image data to be subjected to non-secure printing.

9. The printing apparatus according to claim 1, wherein the non-volatile memory is a NAND flash memory.

10. The printing apparatus according to claim 1, wherein the available capacity of the volatile memory which enables the volatile memory to spool the image data is a predetermined available capacity that is set in advance.

11. A printing method of printing an image based on image data, the method executed by at least one processor of a printing apparatus and comprising:
processing the image data spooled in a volatile memory and in a non-volatile memory; and
attempting to spool the image data in the volatile memory, and attempting to spool the image data in the non-volatile memory when the image data is not successfully spooled in the volatile memory due to a shortage in an available capacity of the volatile memory,
wherein, when the image data is not successfully spooled in the non-volatile memory due to a shortage in an available capacity of the non-volatile memory, an attempt to spool the image data in the volatile memory is started after the available capacity of the volatile memory is increased to enable the volatile memory to spool the image data.

12. The printing method according to claim 11, wherein:
the image data are sequentially input on a predetermined unit basis,
the available capacity of the volatile memory is increased by deletion of the image data in the volatile memory on the predetermined unit basis, and
the available capacity of the non-volatile memory is increased by deletion of the image data in the non-volatile memory on the predetermined unit basis.

13. The printing method according to claim 12, wherein:
the image is printed based on the image data for each predetermined unit, and
the image data for each predetermined unit in any of the volatile memory and the non-volatile memory is deleted as a consequence of the printing of the image corresponding to the image data.

14. The printing method according to claim 12, wherein the predetermined unit is defined on a page basis.

15. The printing method according to claim 11, wherein, when the image data is not successfully spooled in the non-volatile memory due to the shortage in the available capacity of the non-volatile memory, the spooling of the image data in the non-volatile memory is attempted again on condition that the available capacity of the non-volatile memory is increased.

16. The printing method according to claim 11, wherein the image data to be spooled in the volatile memory and in the non-volatile memory is image data developed into a bitmap.

17. The printing method according to claim 11, wherein the printing apparatus is capable of setting a first mode of allowing the spooling of the image data in the volatile memory and the non-volatile memory and a second mode of allowing the spooling of the image data only in the volatile memory.

18. The printing method according to claim 17, wherein:
the image data input while the first mode is set is the image data to be subjected to secure printing, and
the image data input while the second mode is set is the image data to be subjected to non-secure printing.

19. The printing method according to claim 11, wherein the non-volatile memory is a NAND flash memory.

20. A non-transitory computer readable storage medium storing program codes for executing a printing method of printing an image based on image data, the the program codes, when executed by at least one processor of a printing apparatus executing:
processing the image data spooled in a volatile memory and in a non-volatile memory; and
attempting to spool the image data in the volatile memory, and attempting to spool the image data in the non-volatile memory when the image data is not successfully spooled in the volatile memory due to a shortage in an available capacity of the volatile memory,
wherein, when the image data is not successfully spooled in the non-volatile memory due to a shortage in an available capacity of the non-volatile memory, an attempt to spool the image data in the volatile memory is started after the available capacity of the volatile memory is increased to enable the volatile memory to spool the image data.

* * * * *